United States Patent
Futatsuyama et al.

(10) Patent No.: US 7,314,523 B2
(45) Date of Patent: Jan. 1, 2008

(54) MANUFACTURING EQUIPMENT OF SIC SINGLE CRYSTAL AND METHOD FOR MANUFACTURING SIC SINGLE CRYSTAL

(75) Inventors: Kouki Futatsuyama, Kariya (JP); Yasuo Kitou, Okazaki (JP)

(73) Assignee: DENSO CORPORATION, Kariya (JP)

( * ) Notice: Subject to any disclaimer, the term of this patent is extended or adjusted under 35 U.S.C. 154(b) by 69 days.

(21) Appl. No.: 11/211,607

(22) Filed: Aug. 26, 2005

(65) Prior Publication Data
US 2006/0042540 A1   Mar. 2, 2006

(30) Foreign Application Priority Data
Aug. 27, 2004  (JP) ............... 2004-248656
Jul. 4, 2005    (JP) ............... 2005-195558

(51) Int. Cl.
*C30B 35/00* (2006.01)

(52) U.S. Cl. ............... 117/217; 117/15; 117/201; 117/218

(58) Field of Classification Search ............... 117/14, 117/15, 201, 217, 218
See application file for complete search history.

(56) References Cited

U.S. PATENT DOCUMENTS

| | | | |
|---|---|---|---|
| 5,665,159 A | * | 9/1997 | Fuerhoff ............... 117/201 |
| 5,704,985 A | | 1/1998 | Kordina et al. |
| 5,882,402 A | * | 3/1999 | Fuerhoff ............... 117/201 |
| 6,030,661 A | | 2/2000 | Kordina et al. |
| 6,583,810 B1 | * | 6/2003 | Yamamura ............... 348/61 |
| 6,726,764 B2 | * | 4/2004 | Mutti et al. ............... 117/14 |
| 2004/0194694 A1 | | 10/2004 | Sugiyama et al. |

FOREIGN PATENT DOCUMENTS

| | | |
|---|---|---|
| JP | A-6-298594 | 10/1994 |
| JP | A-2001-226197 | 8/2001 |

* cited by examiner

*Primary Examiner*—Felisa Hiteshew
(74) *Attorney, Agent, or Firm*—Posz Law Group, PLC

(57) ABSTRACT

A method for manufacturing a SiC single crystal from a SiC seed crystal is provided. The method includes the steps of: measuring a diameter of the SiC single crystal during a crystal growth of the SiC single crystal; and controlling the diameter of the SiC single crystal to be a predetermined diameter on the basis of the measured diameter. The method provides the SiC single crystal with high quality and large size.

11 Claims, 12 Drawing Sheets

TARGET DIAMETER

REDUCING HEAT

CRYSTAL GROWTH

MANUFACTURING EQUIPMENT OF SIC SINGLE CRYSTAL AND METHOD FOR MANUFACTURING SIC SINGLE CRYSTAL

CROSS REFERENCE TO RELATED APPLICATIONS

This application is based on Japanese Patent Applications No. 2004-248656 filed on Aug. 27, 2004, and No. 2005-195558 filed on Jul. 4, 2005, the disclosures of which are incorporated herein by references.

FIELD OF THE INVENTION

The present invention relates to manufacturing equipment of a SiC single crystal and a method for manufacturing a SiC single crystal.

BACKGROUND OF THE INVENTION

A SiC (silicon carbide) single crystal has high withstand voltage and high electron mobility. Therefore, the SiC single crystal is used for a semiconductor substrate of a power device. The SiC single crystal is formed by a sublimation method (i.e., a modified Lely method).

In the modified Lely method, raw material of SiC is mounted in a graphite crucible. A seed crystal of SiC is mounted on an inner wall of the crucible in such a manner that the seed crystal faces the raw material. Then, the raw material is heated at a temperature in a range between 2200° C. and 2400° C. so that a sublimation gas is generated. The sublimation gas reaches the seed crystal so that the gas is re-crystallized on the seed crystal. Here, the temperature of the seed crystal is set to be a temperature, which is lower than the raw material by a few tens degrees C. to a few hundreds degrees C. Thus, the SiC single crystal is grown on the seed crystal.

In this modified Lely method, as the SiC single crystal is grown, the SiC raw material is deteriorated, i.e., the composition of the raw material is changed. Thus, the growth amount of the SiC single crystal is limited. Even when additional raw material is added into the crucible during the crystal growth of SiC, the concentration of the sublimation gas is deviated from the initial composition so that the single crystal is not continuously grown with high quality. This is because the sublimation gas of SiC has the composition of silicon and carbon, which is not 1:1, i.e., stoichiometric.

A method for forming a SiC single crystal by a CVD method is disclosed in U.S. Pat. No. 6,030,661 and U.S. Pat. No. 5,704,985. Specifically, the SiC single crystal is grown by an epitaxial growth method. In this method, gas phase raw material is used for forming the SiC single crystal. Therefore, the composition of the raw material is controlled stably. Further, the raw material can be supplied continuously.

However, as the SiC single crystal is grown, environment around the growth surface of the seed crystal is changed so that crystal growth conditions are changed. Accordingly, the quality of the single crystal may be changed in a case where the single crystal is grown longer and larger. Specifically, it is difficult to perform the lengthy crystal growth with high crystal quality.

To improve the above problem, a raising growth method such as a CZ method is disclosed as a prior art. This method is such that the crystal is raised up from melted raw material liquid. The crystal growth is controlled at a boundary between solid and liquid. This technique can be applied to gas phase crystal growth. For example, in Japanese Patent Application Publication No. H06-298594, a crucible is moved down, and a seed crystal is moved up, independently. However, this method is the gas phase crystal growth; and therefore, the raw material gas diffuses everywhere. Thus, a SiC poly crystal is grown at everywhere. Thus, the crystalline of the single crystal is deteriorated, and equipment for manufacturing the SiC single crystal is also damaged.

To limit a raw material gas from diffusing, a method for crystal growth with using a guide is disclosed in Japanese Patent Application Publication No. 2001-226197. In this method, the guide is disposed near the side of the seed crystal so that the raw material gas is prevented from penetrating to the side of the seed crystal. Thus, the crystal growth is performed stably. However, the raw material gas is not completely protected, so that a part of the raw material gas penetrates to the side of the seed crystal. Thus, the diameter of the single crystal becomes larger. Therefore, the single crystal having a target diameter is not obtained.

SUMMARY OF THE INVENTION

In view of the above-described problem, it is an object of the present invention to provide manufacturing equipment of SiC single crystal and a method for manufacturing SiC single crystal.

A method for manufacturing a SiC single crystal from a SiC seed crystal is provided. The method includes the steps of: measuring a diameter of the SiC single crystal during a crystal growth of the SiC single crystal; and controlling the diameter of the SiC single crystal to be a predetermined diameter on the basis of the measured diameter.

The method provides the SiC single crystal having high quality and large size. Further, the SiC single crystal having the predetermined diameter is obtained.

Preferably, the step of controlling the diameter is performed together with the crystal growth of the SiC single crystal. Preferably, the crystal growth is performed together with pulling up the seed crystal. Preferably, the diameter of the SiC single crystal is measured on the basis of a combination of multiple measuring methods composed of a method by using X-ray, a method by using a plurality of X-ray generating devices and a plurality of X-ray detectors, a method by using a pair of X-ray generating device and a detector, which is capable of moving around the SiC single crystal, a method on the basis of a difference between a pressure of a downstream side of a raw material gas and a pressure of an upstream side of the raw material gas, a method on the basis of a gas flow amount of the raw material gas, a method on the basis of a gas flow speed of the raw material gas, a method on the basis of an amount of light, a method on the basis of an amount of a light wave or a sound wave, a method on the basis of a weight and a length of the SiC single crystal, and a method on the basis of change of a growth speed of the SiC single crystal. Preferably, the step of controlling the diameter is performed by changing an insertion amount of the SiC single crystal into the guide cover. More preferably, the diameter of the SiC single crystal becomes larger when the insertion amount of the SiC single crystal into a guide hole of the guide cover is large, and the diameter of the SiC single crystal becomes smaller when the insertion amount of the SiC single crystal into the guide hole of the guide cover is small. Preferably, the step of controlling the diameter is performed by changing a plurality of growth parameters. More preferably, the growth parameters include a high responsive growth parameter and a low responsive growth parameter, and the diameter of the SiC single crystal is controlled by changing both of the high responsive growth parameter and the low responsive growth parameter. More preferably, the crystal growth is performed in such a manner that a guide cover is disposed on a side of the SiC single crystal. The crystal growth is performed by supplying a raw material gas to the seed crystal continuously. The high responsive growth parameter is at least one of a group consisting of an insertion amount of the SiC single crystal into a guide hole of the guide cover, a partial pressure of the raw material gas reaching the SiC single crystal, a gas flow amount of the raw material gas reaching the SiC single crystal. Preferably, the low responsive growth parameter is at least one of a group consisting of a temperature of the guide cover and a pulling speed of the SiC single crystal Further, manufacturing equipment of manufacturing a SiC single crystal from a SiC seed crystal includes: measuring means for measuring a diameter of the SiC single crystal during a crystal growth of the SiC single crystal; and controlling means for controlling the diameter of the SiC single crystal to be a predetermined diameter on the basis of the measured diameter. The equipment manufactures the SiC single crystal having high quality and large size. Further, the SiC single crystal having the predetermined diameter is obtained.

Furthermore, manufacturing equipment of manufacturing a SiC single crystal from a SiC seed crystal includes: a cylindrical member; a base including a columnar portion and a circular plate portion; a guide cover disposed on a side of the SiC single crystal; a measuring device for measuring a diameter of the SiC single crystal during a crystal growth of the SiC single crystal; and a controlling device for controlling the diameter of the SiC single crystal to be a predetermined diameter on the basis of the measured diameter. The circular plate portion is disposed on one end of the columnar portion. The circular plate portion has an outer diameter, which is larger than an outer diameter of the columnar portion. The seed crystal is disposed on the other end of the columnar portion. The base is capable of sliding in the cylindrical member in such a manner that an outer surface of the circular plate portion contacts an inner surface of the cylindrical member. The base is capable of sliding in a sliding direction, which is opposite to a growth direction of the SiC single crystal. The guide cover includes a guide hole. The guide cover is disposed on an opening of the cylindrical member. The guide hole has a diameter, which is smaller than an inner diameter of the cylindrical member. The guide hole is capable of passing a raw material gas therethrough toward the seed crystal. The equipment manufactures the SiC single crystal having high quality and large size. Further, the SiC single crystal having the predetermined diameter is obtained.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
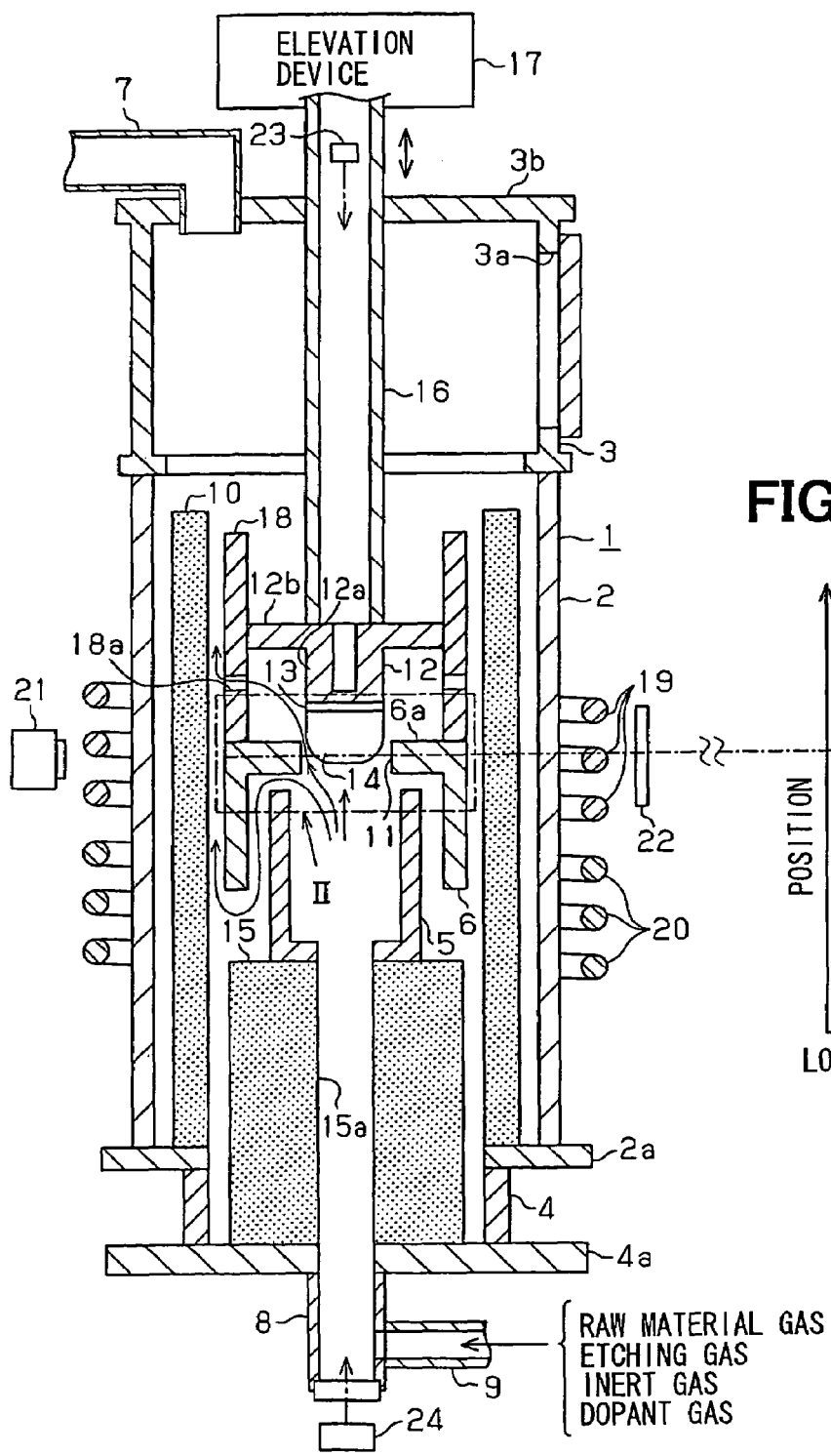
FIG. 1A is a cross sectional view showing manufacturing equipment of SiC single crystal according to a first embodiment of the present invention.
Figure 2:
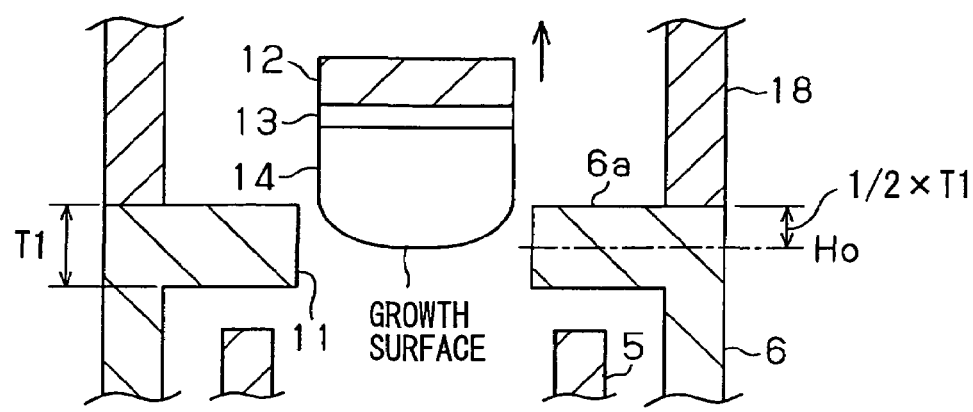
FIG. 2 is a partially enlarged cross sectional view showing a part II of the equipment in FIG. 1A.
Figure 3:
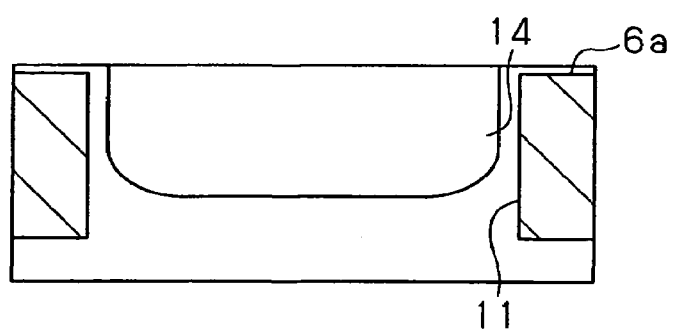
FIG. 3 is a X-ray image showing a part of the equipment, according to the first embodiment.

Manufacturing equipment of a SiC (silicon carbide) single crystal according to a first embodiment of the present invention is shown in FIGS. 1A and 2. FIG. 2 shows a main part of the equipment shown as II in FIG. 1A. The equipment performs to grow a SiC single crystal 14 from a seed crystal 13.

The equipment includes a vacuum chamber 1 having a cylindrical shape. The vacuum chamber 1 is composed of a main chamber 2, an upper chamber 3 and a lower chamber 4. The upper chamber 3 is disposed on the main chamber 2, and the lower chamber 4 is disposed under the main chamber 2. The inside of the main chamber 2, the inside of the upper chamber 3 and the inside of the lower chamber 4 are connected each other. A reaction chamber composed of a lower reaction chamber 5 and an upper reaction chamber 6 is disposed in the main chamber 2. A raw material gas is introduced into the reaction chamber through the lower chamber 4. Further, the SiC single crystal 14 after the crystal growth is retrieved from the upper chamber 3.

The upper chamber 3 is made of, for example SUS (i.e., stainless steel). A retrieve outlet 3a is disposed on the sidewall of the upper chamber 3. The SiC single crystal 14 is retrieved from the retrieve outlet 3a. An exhaust pipe 7 is connected to a cover 3b of the upper chamber 3. Further, the exhaust pipe 7 is connected to a vacuum pump (not shown). The vacuum pump or a vacuum pump system controls pressure of the vacuum chamber 1, and further, performs purge of the vacuum chamber 1.

The main chamber 2 and the lower chamber 4 are made of a quartz tube. The diameter of the lower chamber 4 is smaller than the diameter of the main chamber 2. The main chamber 2 and the lower chamber 4 are connected through a plate 2a. The lower chamber 4 includes a bottom plate 4a, to which a gas introduction pipe 8 is connected. The gas introduction pipe 8 extends in a vertical direction, i.e., an up-and-down direction. The gas introduction pipe 8 is connected to another gas introduction pipe 9. The other gas introduction pipe 9 extends in a horizontal direction.

A heat insulation member 10 is disposed inside of the main chamber 2. The lower reaction chamber 5 having a cylindrical shape and having a bottom is disposed inside of the heat insulation member 10 in the main chamber 2. The lower reaction chamber 5 is vertically arranged in the main chamber 2. The lower reaction chamber 5 is made of graphite. The lower reaction chamber 5 has an upper opening. The upper reaction chamber 6 having a cylindrical shape and having a cover is disposed on the upper opening of the lower reaction chamber 5. The lower reaction chamber 5 and the upper reaction chamber 6 have a positional relationship such that the upper reaction chamber 6 having the cylindrical shape and having the cover covers the lower reaction chamber 5 to cap from the lower opening side of the upper reaction chamber 6. In this case, the outer surface of the lower reaction chamber 5 is separated from the inner surface of the upper reaction chamber 6 by a predetermined distance. The upper end of the lower reaction chamber 5 is separated from a cover as a guide cover 6a of the upper reaction chamber 6.

A guide hole 11 as a through hole for guiding the raw material gas is formed at the center of the cover 6a of the upper reaction chamber 6. The raw material gas passes through the guide hole 11 of the cover 6a. Thus, the cover 6a of the upper reaction chamber 6 provides a guide member for the raw material gas.

A base 12 is disposed over the upper reaction chamber 6. The base 12 is composed of a columnar portion 12a and a circular plate portion 12b as a radial disk portion. The circular plate portion 12b extends in a horizontal direction and has a plate shape. The columnar portion 12a protrudes from the center of the bottom of the circular plate portion 12b. Specifically, the columnar portion 12a protrudes downwardly. The circular plate portion 12b having a disk shape is formed on the top of the circular plate portion. The circular plate portion 12b has a diameter, which is larger than that of the columnar portion 12a. A SiC semiconductor substrate 13 as a seed crystal is attached and fixed on the bottom of the columnar portion 12a. The SiC single crystal 14 is grown from the substrate 13 as the seed crystal through the guide hole 11. The SiC single crystal 14 is grown at the center of the guide hole 11. Thus, the guide member as the guide cover 6a is arranged on the side of the single crystal 14.

In the vacuum chamber 1, the heat insulation member 15 is disposed under the lower reaction chamber 5. The heat insulation member 15 has a raw material gas supply passage 15a. The raw material gas is introduced into the raw material gas supply passage 15a from the gas introduction pipes 8, 9. Then, the raw material gas passes through the raw material gas supply passage 15a so that the raw material gas is supplied to the reaction chambers 5, 6, which are disposed over the supply passage 15a. Specifically, the raw material gas includes a raw material gas such as a $SiH_4$ gas and a $C_3H_8$ gas for providing the raw material of the SiC single crystal, an etching gas such as $H_2$ gas, $CF_4$ gas and $O_2$ gas, an inert gas such as Ar gas and He gas, and a dopant gas such as $N_2$ gas. Therefore, for example, a mixed gas of a silane gas and a propane gas is used as the raw material gas.

The raw material gas is continuously introduced and supplied into the main chamber 2 through the gas introduction pipes 8, 9. The base 12 is fixed on a bottom end of a shaft 16. The shaft 16 extends in the vertical direction. The shaft 16 is connected to a vertical movement device 17 as a crystal raising device (i.e., crystal elevation device) so that the shaft 16 is movable upwardly and downwardly by the device 17. Therefore, when the shaft 16 moves upwardly, the SiC single crystal 14 is moved to the upper chamber 3 as a specimen retrieve chamber. Further, after the seed crystal 13 is attached on the base 12, the shaft 16 moves downwardly so that the seed crystal 13 is moved to the main chamber 2. Further, the growing SiC single crystal 14 can be pulled up with any velocity during the crystal growth. Specifically, as shown in FIG. 2, the thickness of the cover 6a as the guide member is defined as T1. A half of the thickness T1 provides a standard height Ho of the growth surface of the SiC single crystal 14. Here, the thickness T1 of the cover 6a is equal to the length of the guide hole 11. The height of the base 12, i.e., the height of the crystal 14 is controlled to set the growth surface of the crystal 14, that is the bottom of the crystal 14, to be disposed on the standard height Ho. The crystal growth is monitored by X-ray generation equipment 21 and an image tube 22 so that the bottom of the crystal 14 is controlled to be equal to the standard height Ho of the crystal growth. Here, a gas flow direction is from the lower reaction chamber 5 to the upper reaction chamber 3. A growth direction of the SiC single crystal 14 is opposite to the gas flow direction. The seed crystal 13 is pulled up so that a pulling up direction as a moving direction of the seed crystal 14 is opposite to the growth direction.

A cylindrical member 18 is disposed on the upper reaction chamber 6. The base 12 is disposed in the cylindrical member 18. The cylindrical member 18 is made of graphite. The cylindrical member 18 includes multiple through holes 18a, which are disposed under the circular plate portion 12b of the base 12. Each through hole penetrates the cylindrical member 18 in a radial direction. The raw material gas introduced from the guide hole 11 is discharged through the through holes 18a. The inner surface of the cylindrical member 18 contacts the outer surface of the circular plate portion 12b of the base 12. The base 12 slides in the vertical direction with contacting the cylindrical member 18 to the circular plate portion 12b.

Figure 1B:
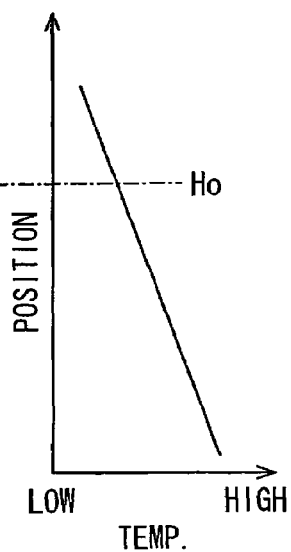
FIG. 1B is a graph showing a relationship between temperature and a position of the equipment shown in FIG. 1A.

In FIG. 1, a high frequency induction coil (i.e., RF coil) 19 as the first RF coil is winded to the outer surface of the vacuum chamber 1. The RF coil 19 is disposed around the height of the guide hole 11. The RF coil 19 works as heating means. The RF coil 19 is energized so that induction current flows through the RF coil 19. The RF coil 19 is disposed around the height of the seed crystal 13, the growing SiC single crystal 14 and the upper reaction chamber 6. Thus, the upper reaction chamber 6 and the inside of the upper reaction chamber 6 are heated by the RF coil 19. Further, another high frequency induction coil 20 as the second RF coil is winded on the outer surface of the vacuum chamber 1. The second RF coil 20 is disposed under the first RF coil 19. The second RF coil 20 is energized so that the lower reaction chamber 5, the upper reaction chamber 6 and the inside of them are heated by the second RF coil 20. The first and the second RF coils 19, 20 can be independently controlled. FIG. 1B shows a temperature profile of the inside of the equipment in the vertical direction when the SiC single crystal is grown. The temperature of the inside of the lower reaction chamber 5 is higher than the temperature of the guide hole side, which is disposed over the lower reaction chamber 5.

The X-ray generating equipment 21 as X-ray generating means and the image tube 22 as X-ray detecting means, i.e., a X-ray detector, are disposed outside of the vacuum chamber 1. The X-ray generating equipment 21 generates X-ray, and the image tube 22 detects the X-ray. The equipment 21 and the tube 22 observe the crystal 14 through the X-ray so that they work as diameter measurement means. The equipment 21 and the tube 22 are disposed outside of the RF coil 19. The equipment 21 is opposite to the tube 22 so that they sandwich the guide hole 11 as a crystal growth chamber. The equipment 21 radiates the X-ray toward the guide hole 11, i.e., the edge of the growth surface of the growing SiC single crystal 14. The tube 22 receives the X-ray through the vacuum chamber 1. Then, the tube 22 outputs a signal corresponding to the strength of the detected X-ray. Thus, the X-ray transmits the reaction chamber 6 and the crystal 14 so that the distribution of strength of the transmitted X-ray is detected by the image tube 22. The edge of the growth surface of the growing crystal 14 can be observed as an image of the X-ray. Specifically, the absorption coefficient of X-ray of SiC is higher than that of carbon (i.e., C), which composes the reaction chamber 6. Accordingly, the crystal 14 and the graphite reaction chamber 6 can be observed separately. The equipment 21 and the tube 22 provide X-ray generating and receiving apparatus for observing the diameter of the growing crystal 14 directly. The equipment 21 and the tube 22 provide the means for measuring the diameter of the crystal 14.

A pyrometer 23 as the first pyrometer is disposed in the shaft 16, and another pyrometer 24 as the second pyrometer is disposed under the gas introduction pipe 8. The first and the second pyrometers 23, 24 detects the temperature of the inside atmosphere of the base 12 and the reaction chambers 5, 6.

Next, a method for manufacturing the SiC single crystal 14 is described as follows. When the single crystal 14 is grown, the seed crystal 13 is mounted. Then, the vacuum chamber 1 is vacuumed, and an argon gas (i.e., Ar gas) is introduced into the chamber through the gas introduction pipes 8, 9. Then, the RF coils 19, 20 are energized, so that the reaction chambers 5, 6 are heated by an induction heating method. The temperature of the inside of the reaction chambers 5, 6 is held at a predetermined temperature, and stabilized. Preferably, the temperature is held near 2400° C., which is a sublimation temperature of SiC. At the same time, a predetermined pressure is applied to the inside of the guide hole 11. Thus, the raw material gas is introduced into the reaction chambers 5, 6 through the raw material gas supply passage 15a so that the pressure of the inside of the guide hole 11 is controlled to be a predetermined pressure. The raw material gas is supplied to the seed crystal 13 so that the crystal growth on the seed crystal 13 starts.

During the crystal growth, the base 12 is raised up to control the growth surface of the growing crystal 14 to be equal to the standard height Ho of growth surface. A part of the raw material gas flows through the guide hole 11, and passes through a through hole 18a of a cylindrical member 18. Then, the gas flows toward the exhaust pipe 7. Another part of the raw material gas passes through a clearance between the outer surface of the reaction chamber 5 and the inner surface of the reaction chamber 6, and then, the gas flows toward the exhaust pipe 7.

The SiC single crystal 14 is grown in accordance with supply of the raw material gas to the seed crystal 13. When the length of the SiC single crystal 14 becomes a predetermined length, the supply of the raw material gas is stopped. Then, the single crystal 14 is retrieved from the retrieve outlet 3a.

Figure 4A:
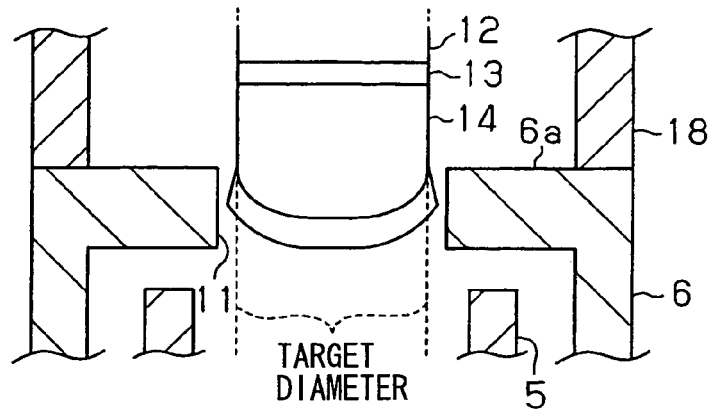
FIGS. 4A to 4C are partially enlarged plan views explaining a method for manufacturing the SiC single crystal, according to the first embodiment.
Figure 4B:
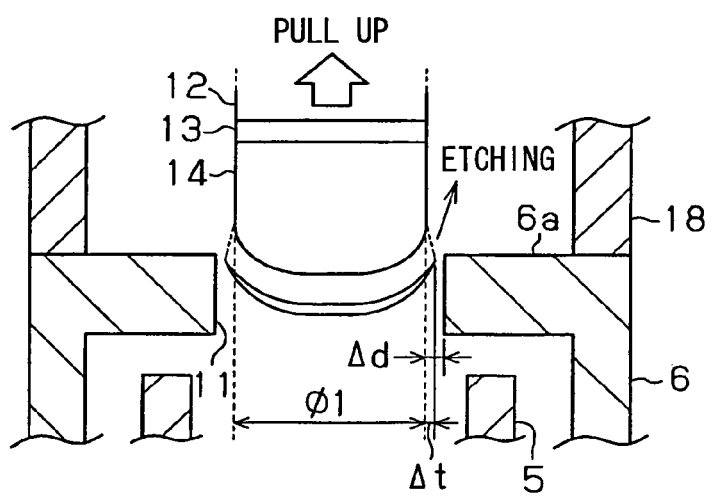
Figure 4C:
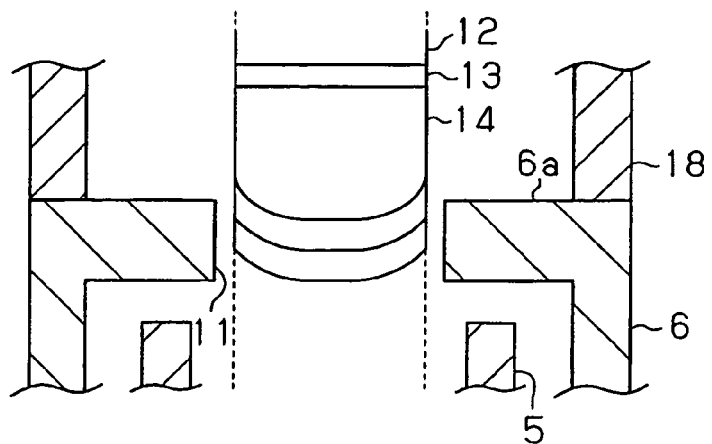
Figure 5A:
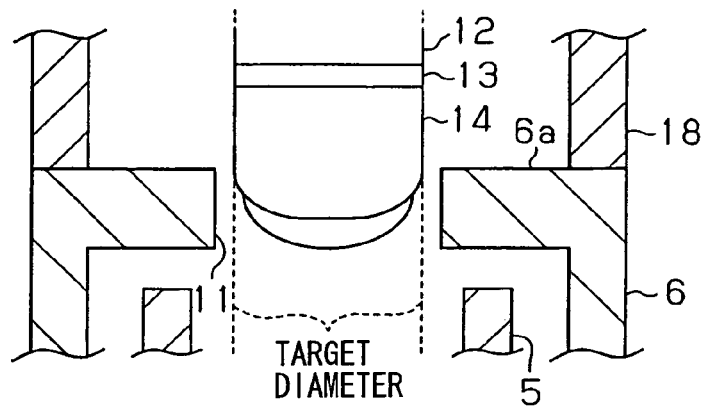
FIGS. 5A to 5C are partially enlarged plan views explaining the method for manufacturing the SiC single crystal, according to the first embodiment.
Figure 5B:
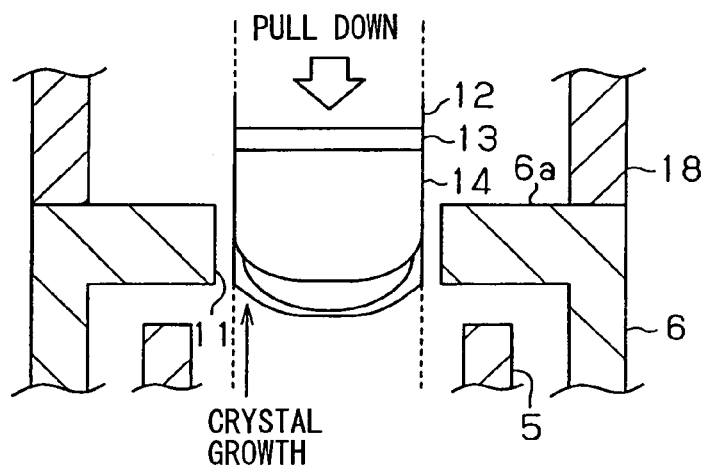
Figure 5C:
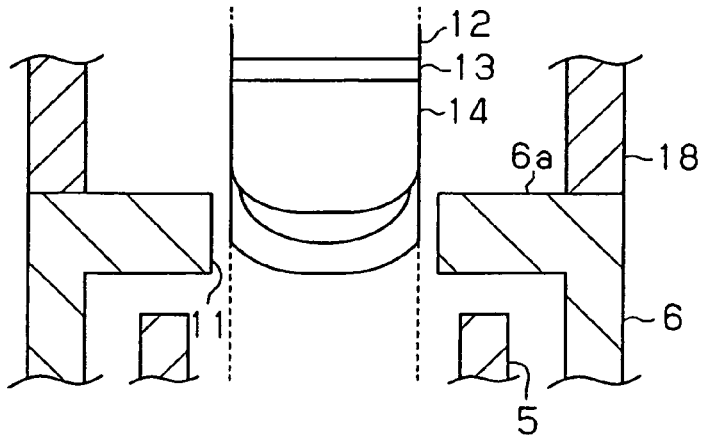

A control method of the diameter of the single crystal 14 is described as follows. FIGS. 4A to 4C explain a process in a case where the diameter of the crystal 14 expands during the crystal growth. FIGS. 5A to 5C explain another process in a case where the diameter of the crystal 14 shrinks during the crystal growth.

Firstly, the diameter of the crystal 14 is observed. The observation is performed by the X-ray generating equipment 21 and the image tube 22. When the diameter of the crystal 14 expands, the diameter of the crystal 14 is controlled to shrink. This is, when the diameter of the crystal 14 becomes larger, the diameter of the crystal 14 is controlled to be smaller so that the diameter reaches the target diameter. Specifically, the insertion of the crystal 14 into the guide hole 11 becomes shallower, that is to pull up the crystal 14. Thus, the raw material gas reached on the side of the crystal 14 is diffused to a top of the cover 6a, so that the gas does not deposit on the side of the crystal 14. Further, a part of the crystal 14, which is a diameter expanding portion of the crystal 14, is etched and sublimes. Thus, the diameter of the crystal 14 becomes smaller. The raw material gas reached on the bottom of the crystal 14 adheres on the bottom, i.e., the growth surface of the crystal 14. Thus, the crystal growth on the growth surface of the crystal 14 is performed. Then, the insertion of the crystal 14 returns to a standard position, as shown in FIG. 4C.

When the diameter of the crystal shrinks, as shown in FIG. 5A, the diameter of the crystal 14 is controlled to expand. This is, when the diameter of the crystal 14 becomes smaller, the diameter of the crystal 14 is controlled to be larger so that the diameter reaches the target diameter. Specifically, the insertion of the crystal 14 into the guide hole 11 becomes deeper, that is to pull down the crystal 14. Thus, the resistance of the raw material gas flowing toward the top of the guide hole 11 through the clearance between the inner surface of the guide hole 11 and the crystal 14 becomes larger. Thus, the retention time of the gas on the side of the crystal 14 becomes longer. As a result, the crystal growth in the radial direction proceeds at a diameter shrinking portion of the crystal 14. Thus, the diameter of the crystal 14 becomes larger. The raw material gas reached on the bottom of the crystal 14 adheres on the growth surface of the crystal 14. Thus, the crystal growth on the growth surface of the crystal 14 is performed. Then, the insertion of the crystal 14 returns to a standard position, as shown in FIG. 5C.

The above control is performed by a person or automatically during the crystal growth. Thus, the SiC single crystal ingot with high quality is obtained. In this embodiment, the diameter control means for controlling the diameter of the crystal 14 to be a predetermined diameter is provide by the cover 6a and the vertical movement equipment 17 on the basis of the measurement result of the diameter of the crystal 14 measured by the diameter detecting means.

The detailed description of the control is described as follows.

Firstly, the seed crystal 13 is mounted on the base 12. The seed crystal 13 has an initial diameter of φ1, which is 100 mm. The seed crystal is mounted at a predetermined position. The seed crystal 13 is mounted on the base 12 in such a manner that a C-surface, i.e., a (0001)-surface of 4H—SiC crystal structure faces the guide hole 11. The inner diameter of the guide hole 11 is 102 mm. Therefore, a distance Δd between the inner surface of the guide hole 11 and the seed crystal 13 or the SiC single crystal 14 is 1 mm. The thickness of the cover 6a is 20 mm. Therefore, in the standard position of the seed crystal 13, the bottom, i.e., the growth surface of the seed crystal 13 is inserted into the guide hole 11 by 10 mm. The standard height Ho is disposed from the bottom of the cover 6a by 10 mm.

Then, the vacuum chamber 1 is vacuumed, and the argon gas is introduced into the chamber 1 through the gas introduction pipes 8, 9 with flowing amount of 10 SLM (i.e., standard liter per minute). Then, the RF coils 19, 20 are energized, so that the temperature of the inside of the reaction chambers 5, 6 is heated up to 2400° C. Then, when the temperature of the inside of the reaction chambers 5, 6 is stabilized around 2400° C., the pressure of the chamber 1 is set to be $2.66 \times 10^4$ Pa. Thus, the raw material gas is introduced into the reaction chambers 5, 6 by using a mass flow controller and the like. Specifically, a $SiH_4$ gas is introduced with a flow rate of 1.2 SLM, a $C_3H_8$ gas is introduced with a flow rate of 0.32 SLM, and an argon gas is introduced with a flow rate of 3.0 SLM. Then, the crystal growth starts. At the same time, the X-ray generating equipment 21 is driven so that the diameter of the crystal 14 and the crystal growth rate of the crystal 14 are measured. The base 12, i.e., the crystal 14 is pull up in accordance with the growth rate, so that the edge of the crystal 14 is ordinary inserted into the guide hole 11 by 10 mm.

One example of the crystal growth is as follows. From the beginning of the crystal growth, the diameter of the crystal 14 becomes larger slightly. After the crystal growth is performed for five hours, the length of the grown crystal 14 becomes 7 mm. At that time, the diameter of the crystal 14 is 100.4 mm. Therefore, the radius of the crystal 14 expands by 0.2 mm. The expansion of the radius reaches about 20% of the distance Δd between the inner surface of the guide hole 11 and the crystal 14. Here, the distance Δd is initially 1 mm. Accordingly, the crystal 14 is pulled up from the guide hole 11 by 5 mm so that the growth surface of the crystal 14 is inserted into the guide hole 11 by 5 mm. Then, the crystal growth is maintained for 30 minutes. After that, the diameter of the crystal 14 is reduced to 100 mm. Then, the growth surface of the crystal 14 is inserted into the guide hole 11 by 7 mm. Then, the crystal growth is continued for 7 hours. After that, the diameter of the crystal 14 becomes to be 99.6 mm. Then, the growth surface of the crystal 14 is pull down by 10 mm. Then, the crystal growth is continued. By repeating these steps, the crystal growth is performed for 50 hours with continuous growth. Then, the SiC single crystal having the growth length of 65 mm is obtained.

Thus, the crystal growth is performed with pulling the crystal 14 up and down. In general, the raw material of the SiC crystal is the raw material gas. Therefore, the raw material gas may penetrate around the seed crystal 13, or the grown crystal 14 may be sublimed, so that the diameter of the crystal 14 becomes smaller or larger. To solve the above problem, in this embodiment, the diameter of the growing crystal 14 is observed, so that the diameter of the crystal is controlled to be a predetermined diameter. Specifically, the diameter of the crystal 14 is observed by using the transmitted X-ray so that the inside of the reaction chambers is observed. The control of the diameter is performed by an insertion amount of the crystal 14 into the guide hole 11 so that the raw material gas flowing to the side of the crystal 14 is controlled. These steps are repeated by multiple times. Then, the SiC single crystal having high quality and having large length is obtained. Thus, the crystal growth is continuously performed.

The method for manufacturing the SiC single crystal includes two steps. One is to measure the diameter of the growing crystal 14 directly. The other is to control the diameter of the growing crystal 14 to be a predetermined diameter as a target diameter. Thus, the crystal having a predetermined diameter is obtained. This is, the crystal having a large length can be grown without deviating the target diameter. By controlling the diameter to enlarge or to reduce, the SiC single crystal is grown without contacting the cover 6a. Thus, by measuring the diameter of the crystal 14, a direction of control of the diameter is determined.

Further, the diameter of the crystal 14 is controlled together with growing the crystal 14, as shown in FIGS. 4B and 5B. Further, the raw material gas is continuously supplied, so that the crystal growth is effectively performed.

Further, since the crystal 14 is pulling up during the crystal growth, the growth condition is stable and substantially constant. Thus, the crystal growth is performed stably. Further, the diameter of the crystal 14 can be controlled easily by using the cover 6a as the guide member. Here, the cover 6a is disposed on the side of the crystal 14.

The diameter of the crystal is controlled accurately on the basis of the observation of the diameter by using the X-ray. The X-ray observation can be performed from the bottom of the crystal 14 so that the crystal 14 is observed directly.

The measurement position of the diameter of the crystal 14 by using the X-ray is the edge of the growth surface of the crystal 14. Therefore, even when the observation region is narrow, the diameter change is effectively observed. Therefore, the X-ray generating equipment 21 and the image tube 22 can be smaller.

Further, the diameter of the crystal 14 is controlled by the insertion of the crystal 14 into the cover 6a. Therefore, the growth condition near the growth surface is not changed substantially. Thus, the diameter of the crystal 14 can be controlled with performing the crystal growth. Specifically, the crystal 14 is inserted into the cover 6a deeply so that the diameter of the crystal 14 becomes larger. This is because the flowing resistance of the raw material gas is increase when the crystal 14 is inserted into the guide hole 11 deeply. Thus, the adhesion of the gas on the side of the crystal 14 proceeds so that the diameter of the crystal 14 increases. Further, the crystal 14 is inserted into the cover 6a shallowly so that the diameter of the crystal 14 becomes smaller. This is because the flowing resistance of the raw material gas is decreased when the crystal 14 is inserted into the guide hole 11 shallowly. Thus, the adhesion of the gas on the side of the crystal 14 is reduced so that the diameter of the crystal 14 decreases. Thus, the diameter of the crystal 14 can be controlled without changing a main parameter such as temperature and pressure. Here, the main parameter affects the quality of the crystal 14.

Here, the diameter of the crystal 14 is controlled as follows. As shown in FIG. 4B, a deviation Δt from a radius of a target diameter φ1 is controlled to be in a range between +20% and −20% of the distance Δd between the inner surface of the guide hole 11 and the SiC single crystal 14. The deviation Δt can be controlled in a range between +50% and −50% of the distance Δd. This is because the flowing resistance of the raw material gas penetrating to the top of the cover 6a becomes larger when the diameter becomes larger. Thus, the diameter of the crystal 14 is rapidly increased. When the diameter of the crystal 14 becomes smaller, the flowing resistance of the gas becomes smaller. Thus, the diameter of the crystal 14 is rapidly reduced. As a result, when the deviation Δt is out of the range between +50% and −50% of the distance Δd, increasing amount or decreasing amount of the diameter of the crystal 14 becomes larger than speed of controlling the diameter. Therefore, it is difficult to control the diameter. Thus, it is required to control the deviation Δt to be in a range between +50% and −50% of the distance Δd.

Further, it is preferred that the deviation Δt is controlled to be in a range between +2% and −2% of the radius of the target diameter φ1 of the crystal 14. In this case, heat emission amount of the crystal 14 to the base 12 and heat radiation are not changed substantially. Therefore, the crystal growth condition can be maintained stably. Specifically, since the SiC single crystal 14 is grown at high temperature near 2000° C., the heat radiation affects the crystal growth. Therefore, when the diameter of the crystal 14 changes, the temperature distribution around the reaction chambers 5, 6 also changes. Accordingly, when the deviation Δt is out of the range between +2% and −2% of the radius of the target diameter φ1 of the crystal 14, it is difficult to control the temperature distribution accurately. Further, when the deviation Δt is in a range between +2% and −2% of the radius of the target diameter φ1 of the crystal 14, it is easy to perform a later process such as wafer process.

Second Embodiment

Figure 6A:
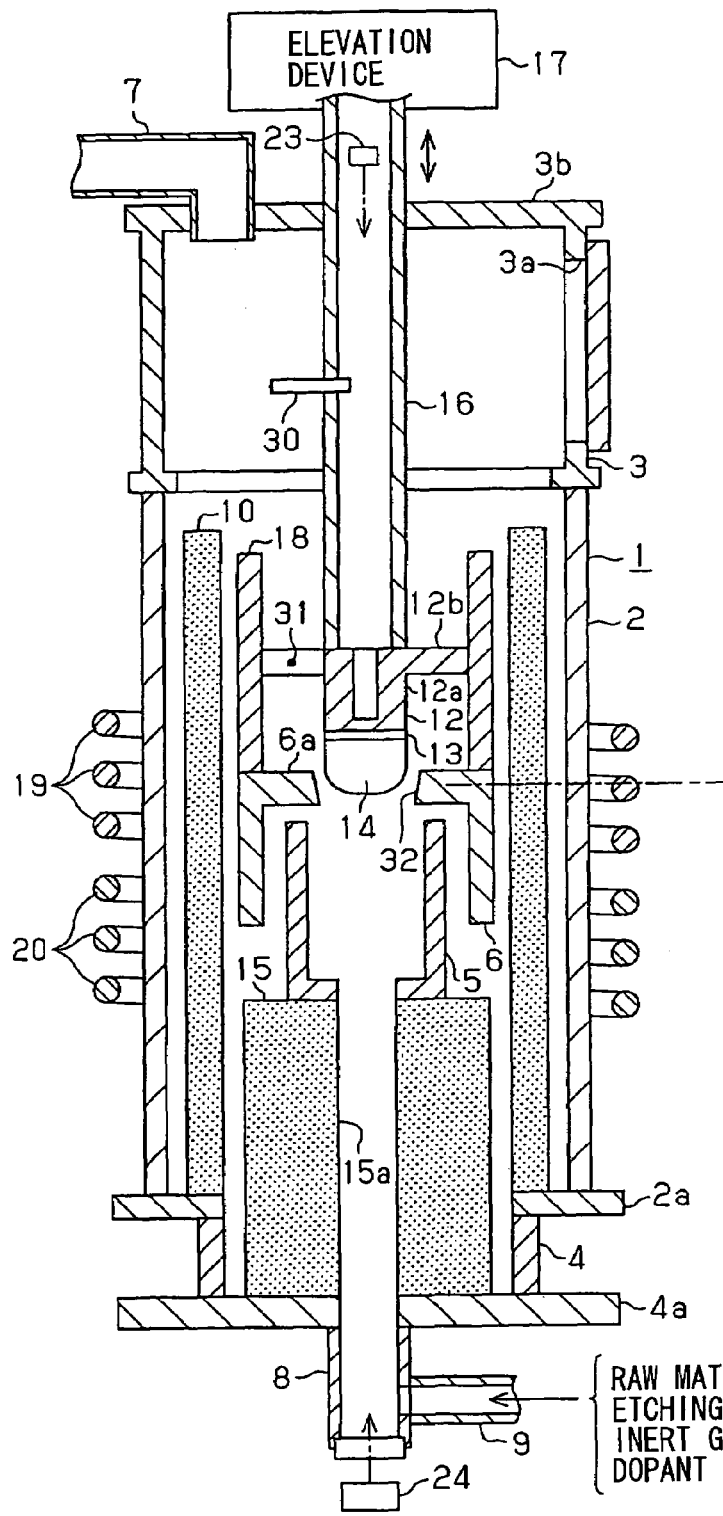
FIG. 6A is a cross sectional view showing manufacturing equipment of SiC single crystal according to a second embodiment of the present invention.
Figure 6B:
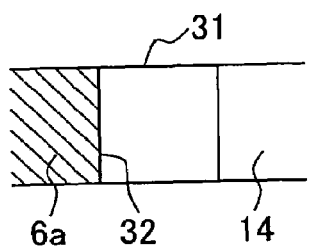
FIG. 6B is an optical image showing a part of the equipment.
Figure 6C:
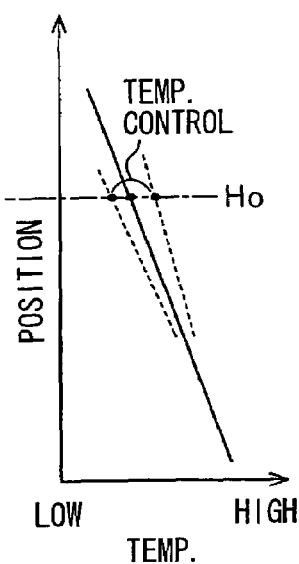
FIG. 6C is a graph showing a relationship between temperature and a position of the equipment shown in FIG. 6A.

Manufacturing equipment for manufacturing a SiC single crystal according to a second embodiment of the present invention is shown in FIG. 6A. Although the equipment shown in FIG. 1 includes the X-ray generating equipment 21 and the image tube 22, the equipment shown in FIG. 6A includes an optical detector 30. The optical detector 30 measures amount of light passing through a guide hole 32 so that the optical detector 30 indirectly measures the diameter of the crystal 14. Specifically, the optical detector 30 indirectly measures a distance between the crystal 14 and the cover 6a by detecting leakage of the light. The optical detector 30 is fixed on the shaft 16. A slit 31 for observing the light is formed on the circular plate portion 12b of the base 12. The light to be observed is, for example, radiation light from the top of the cover 6a and radiation light from the reaction chambers 5, 6 passing through a clearance between the crystal 14 and the cover 6a. The radiation light from the reaction chambers 5, 6 is emitted at high temperature higher than that of the radiation light from the top of the cover 6a. Therefore, they can be separately observed. Accordingly, change of the distance between the crystal 14 and the cover 6a, i.e., the inner surface of the guide hole 32, can be estimated on the basis of change of the radiation light from the reaction chambers 5, 6. Thus, the diameter of the crystal 14 can be measured indirectly. The guide hole 32 has a tapered shape so that a diameter of the guide hole 32 becomes larger as it goes to upside. Here, the upside of the equipment is a pulling up direction. Thus, the diameter of the crystal 14 becomes a little larger as the crystal growth proceeds. FIG. 6B shows an observed view of the optical detector 30. FIG. 6C shows a temperature distribution of the inside of the chambers 5, 6.

Figure 7A:
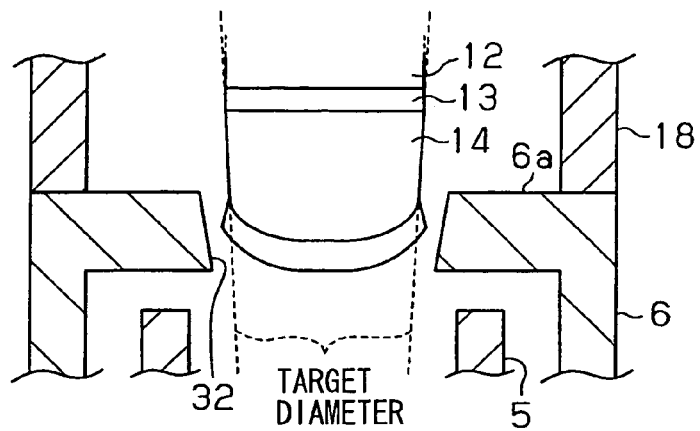
FIGS. 7A to 7C are partially enlarged plan views explaining a method for manufacturing the SiC single crystal, according to the second embodiment.
Figure 7B:
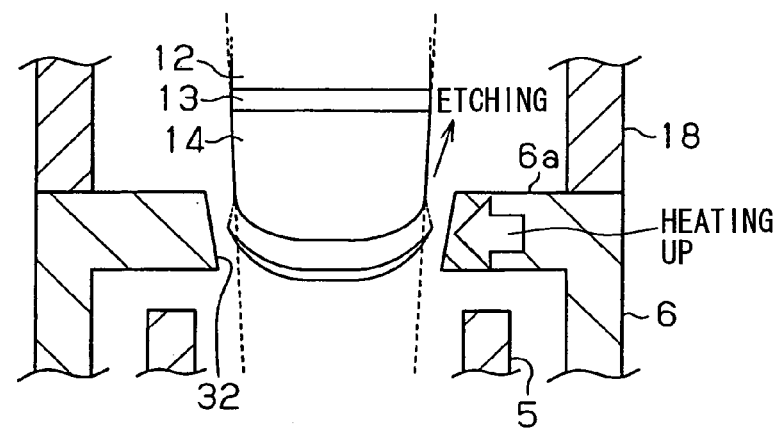
Figure 7C:
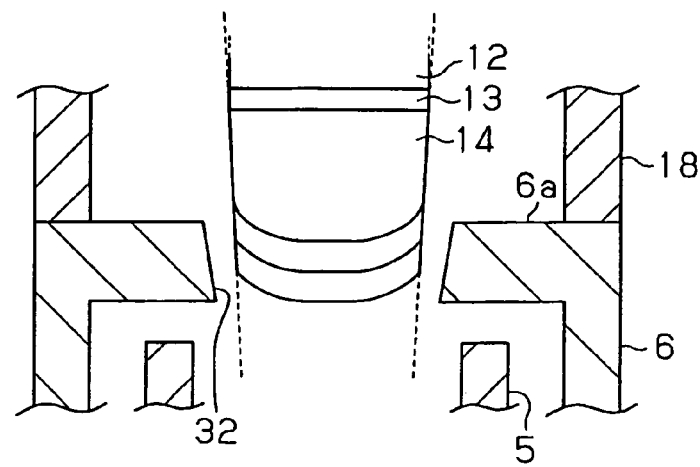
Figure 8A:
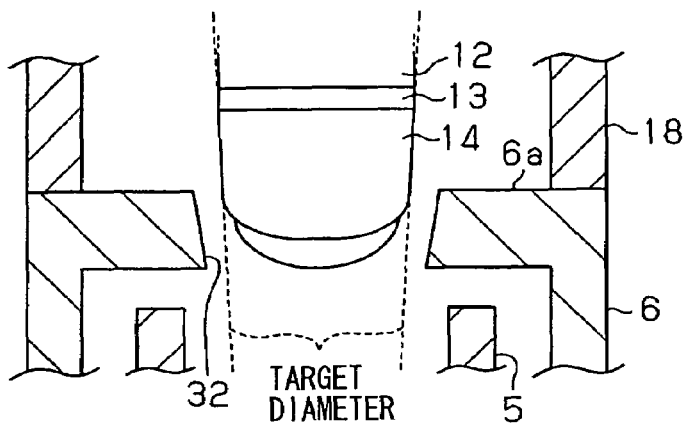
FIGS. 8A to 8C are partially enlarged plan views explaining the method for manufacturing the SiC single crystal, according to the second embodiment.
Figure 8B:
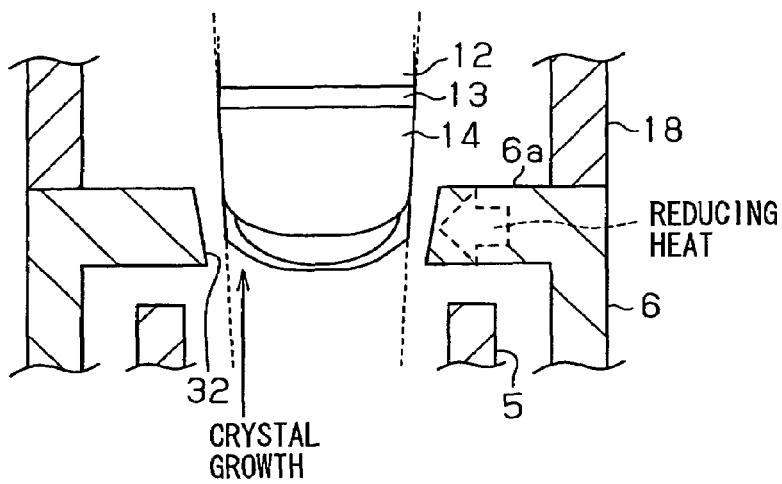
Figure 8C:
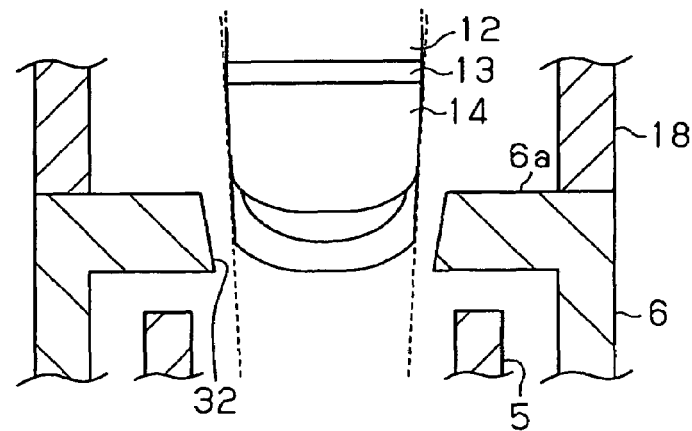

The control method for the diameter of the crystal 14 is described as follows. FIGS. 7A to 7C explain a process in a case where the diameter of the crystal 14 expands during the crystal growth. FIGS. 8A to 8C explain another process in a case where the diameter of the crystal 14 shrinks during the crystal growth.

Firstly, as shown in FIG. 7A, the diameter of the crystal 14 is observed. For example, when the diameter of the crystal 14 becomes larger than a target diameter, the crystal growth is controlled to reduce the diameter of the crystal 14, as shown in FIG. 7B. In this case, the electricity of the RF coil 19 disposed upside of the equipment is increased so that the temperature of the cover 6a becomes higher. Thus, the temperature of the side of the crystal 14 is increased intensively. As a result, the outer periphery of the bottom of the crystal 14 is etched so that the diameter of the crystal 14 is decreased. On the other hand, the temperature of the center of the bottom of the crystal 14 is not changed substantially, since the radiation from the power reaction chamber 5 and the emission to the base 12 mainly affect the temperature of the crystal 14. Accordingly, the raw material gas reached to the bottom of the crystal 14 adheres on the bottom so that the crystal growth is performed on the bottom of the crystal 14. Thus, as shown in FIG. 7C, the diameter of the crystal 14 is reduced, and then, the crystal growth continues.

As shown in FIG. 8A, when the diameter of the crystal 14 becomes smaller than the target diameter, the crystal growth is controlled to increase the diameter of the crystal 14. In this case, the electricity of the RF coil 19 is reduced, so that the temperature of the cover 6a is reduced. As a result, the temperature of the side of the crystal 14 is also reduced. Thus, the crystal growth on the side of the crystal 14 proceeds in the radial direction, so that the diameter of the crystal 14 becomes larger. Further, the raw material gas reached on the center of the bottom of the crystal 14 adheres on the bottom so that the crystal growth proceeds. Next, as shown in FIG. 8C, the crystal growth continues.

These operations are performed by an operator or automatically. Thus, the SiC single crystal ingot having high quality is obtained.

The detailed description of the equipment according to this embodiment is described as follows.

Firstly, the seed crystal 13 is mounted on the base 12. The seed crystal 13 has a diameter of 100 mm, and disposed on a predetermined position. The C-surface of 4H—SiC crystal structure (i.e., a (0001)-surface) of the seed crystal 13 faces the guide hole 32. The guide hole 32 has a lower side inner diameter of 102 mm, and an upper side inner diameter of 104 mm. Thus, the tapered shape of the guide hole 32 expands toward the pulling up direction. The thickness of the cover 6a, i.e., the length of the guide hole 32, is 20 mm. The growth surface (i.e., the bottom) of the seed crystal 13 is inserted into the guide hole 32 by 10 mm. The distance between the cover 6a and the crystal 13 is 1.5 mm at the growth surface of the crystal 13.

Then, the vacuum chamber 1 is vacuumed. Further, the argon gas is introduced into the chamber 1 through the gas introduction pipes 8, 9. The flowing amount of the gas is 10 SLM.

Then, the RF coils 19, 20 are energized so that the reaction chambers 5, 6 are heated up to 2400° C. When the temperature of the reaction chambers 5, 6 are stabilized near 2400° C., the pressure of the vacuum chamber 1 is set to be $2.66 \times 10^4$ Pa. The raw material gas is introduced into the reaction chambers 5, 6 by controlling with using a mass flow controller and the like. The raw material gas includes the $SiH_4$ gas, the $C_3H_8$ gas and the Ar gas. The flow rate of the $SiH_4$ gas is 1.2 SLM, the flow rate of the $C_3H_8$ gas is 0.32 SLM, and the flow rate of the Ar gas is 3.0 SLM. The light through the guide hole 32 is detected by the optical detector 30, so that the diameter of the crystal 14 is estimated.

During the crystal growth, the base 12 is pulled up in accordance with crystal growth speed so that the bottom of the crystal 14 is inserted into the guide hole 32 by 10 mm. Accordingly, the position of the bottom of the crystal 14 is maintained to be at the standard height Ho during the crystal growth.

From the beginning of the crystal growth, the diameter of the crystal 14 becomes larger. After the crystal growth is performed for seven hours, the length of the crystal 14 becomes 10 mm. At that time, the diameter of the crystal 14 becomes 101.2 mm. Thus, the radius of the crystal 14 becomes larger by 0.6 mm. Therefore, the increase of the radius of the crystal 14 is 40% of the initial distance between the crystal 14 and the cover 6a. Here, the initial distance is 1.5 mm. Then, the electricity of the upper RF coil 19 is increased. After the crystal growth is continued for two hours, the diameter of the crystal 14 is reduced to 100 mm. In this case, the growth speed of the crystal 14 is reduced from 1.4 mm/hour to 1.1 mm/hour. After that, the electricity of the upper RF coil 19 is increased. The crystal growth is continued.

In a case where the guide hole 32 has the tapered shape, the crystal 14 can be pulled up even when the diameter of the crystal 14 is increased. Therefore, the controllable range of the crystal growth becomes larger, and therefore, it is easy to control the crystal growth.

Thus, the crystal growth is totally performed for 50 hours. The SiC single crystal ingot having the length of 60 mm is obtained.

Thus, the diameter of the growing crystal 14 is obtained by measuring the light amount passing through the guide hole 32. Therefore, the measurement of the diameter can be performed apart from the growth surface of the crystal 14, so that the measurement can be performed without affecting the crystal growth.

Further, the diameter of the crystal 14 is controlled by changing the temperature of the cover 6a. This is, the crystal growth is controlled by the temperature of the crystal 14 so that the diameter of the crystal 14 is controlled. Thus, it is easy to control the diameter of the crystal 14.

Although the measuring means of the diameter is the optical detector 30, the means can be other methods as follows.

Figure 9:
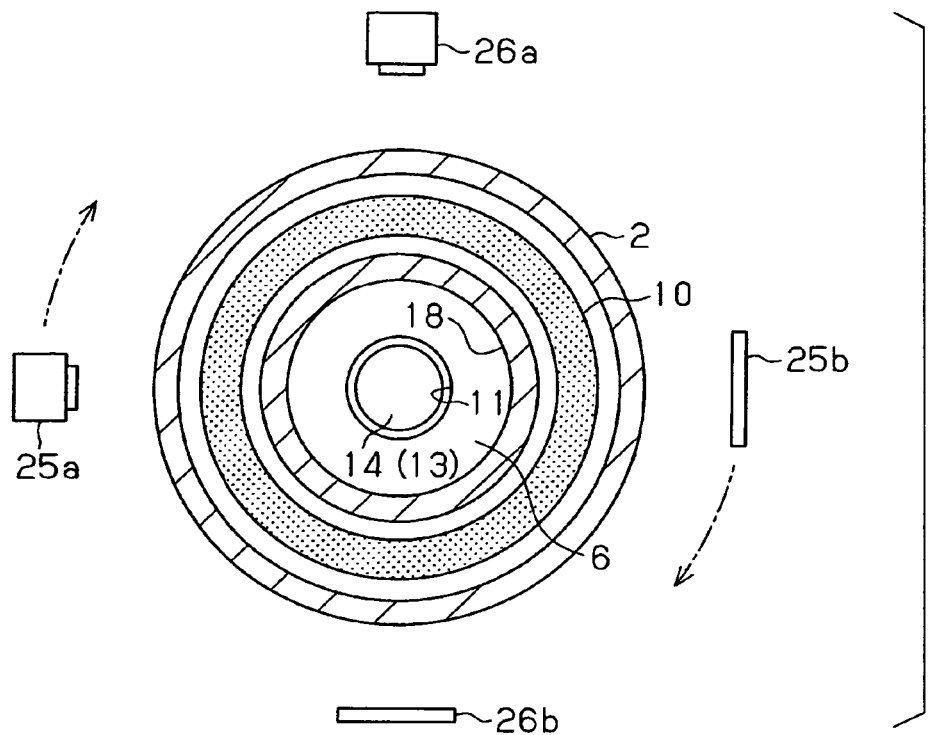
FIG. 9 is a cross sectional view showing manufacturing equipment of SiC single crystal according to a modification of the first embodiment.

For example, as shown in FIG. 9, the equipment includes multiple X-ray generating equipments 25a, 26a as a generator of the X-ray and multiple image tubes 25b, 26b as a receiver of the X-ray. They are disposed around the crystal 14. When the diameter of the crystal 14 is measured, multiple X-ray generating equipments 25a, 26a and multiple tubes 25b, 26b are used so that the diameter is measured from multiple directions.

Further, the equipment includes a pair of X-ray generator and an image tube, which are movable. When the diameter of the crystal 14 is measured, the X-ray generator and the image tube are moved so that the diameter is measured from different directions. Thus, the diameter is measured in different multiple directions, so that the diameter is controlled more accurately.

Figure 10:
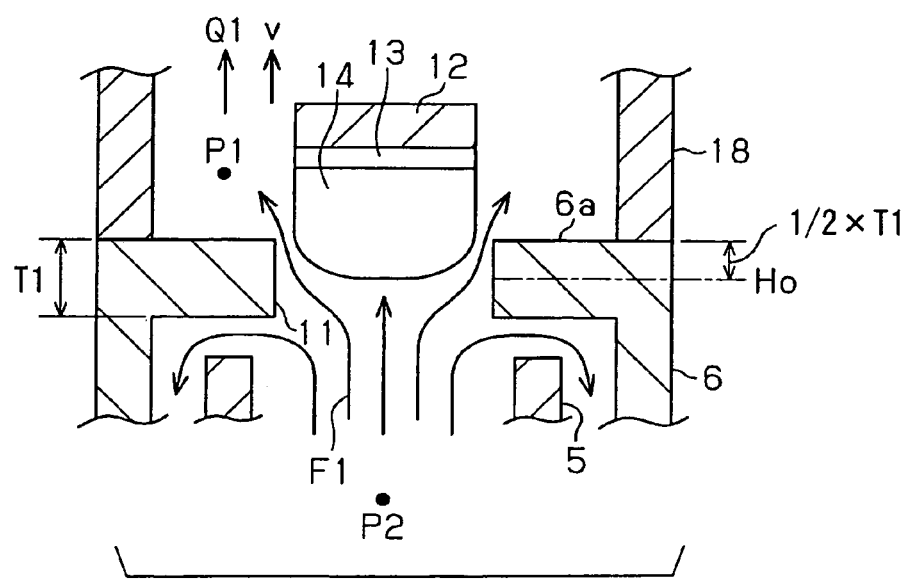
FIG. 10 is a partially cross sectional view showing manufacturing equipment of SiC single crystal according to a second modification of the first embodiment.

Further, as show in FIG. 10, the raw material gas flows along with an arrow F1. The pressure disposed downstream side of the gas flow is defined as P1, and the pressure disposed on upstream side of the gas flow is defined as P2. The diameter of the crystal 14 is estimated on the basis of the difference between the pressure P1 and the pressure P2. Further, the diameter of the crystal 14 can be measured indirectly on the basis of a gas flow amount Q1 of the gas flowing through the guide hole 11. Furthermore, the diameter of the crystal 14 can be measured indirectly on the basis of a gas flow speed v of a gas flowing through the guide hole 11. Thus, the diameter of the crystal 14 can be detected by using the gas flow F1 of the gas flowing through the guide hole 11 from the reaction chambers 5, 6 to the top of the cover 6a. Specifically, the diameter is detected by a parameter of the gas flow F1. These methods can provide the measuring method of the diameter easily without complicated equipment.

Figure 11:
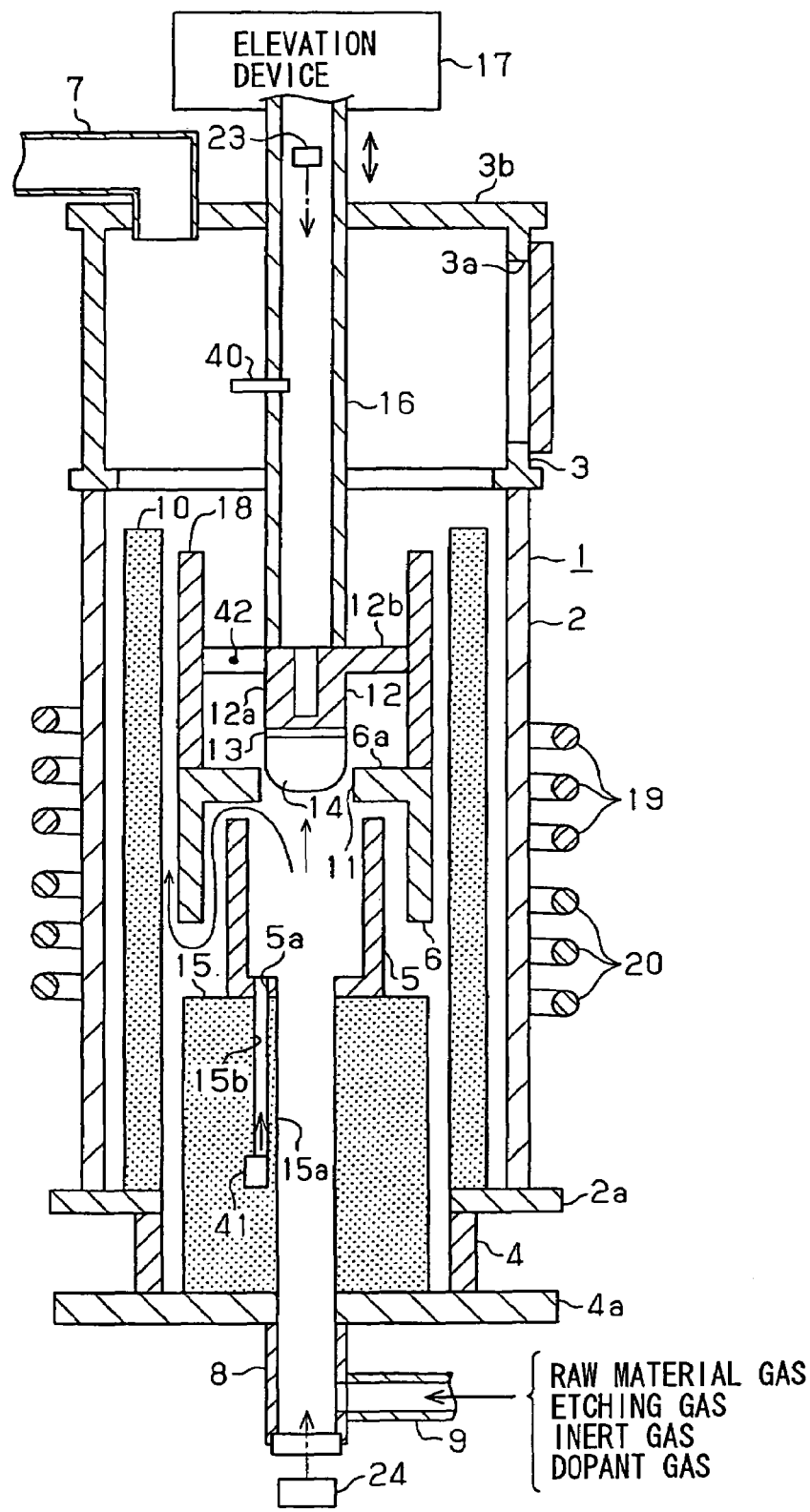
FIG. 11 is a cross sectional view showing manufacturing equipment of SiC single crystal according to a modification of the second embodiment.

Furthermore, as shown in FIG. 11, the equipment includes a light emission device 41, which is embedded in the heat insulation member 15. The light emission device 41 emits the light, and the light passes through a through holes 5a, 15b toward the guide hole 11. Then, a light detector 40 detects the light passing through a slit 42. The slit 42 is formed in the base 12. Although the equipment includes the light emission device 41, the equipment can include a sound wave emission device. Thus, the light amount or the sound wave amount passing through the guide hole 11 is detected so that the diameter of the crystal 14 is indirectly measured. Thus, the diameter can be measured without affecting the growth condition.

Figure 12:
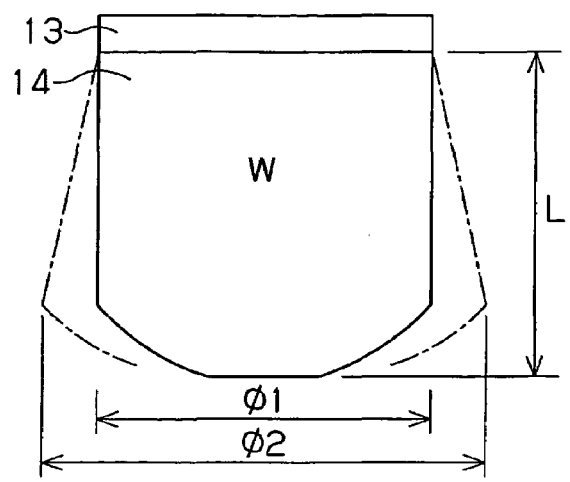
FIG. 12 is a cross sectional view showing a SiC single crystal in manufacturing equipment of SiC single crystal according to a second modification of the second embodiment.
Figure 13:
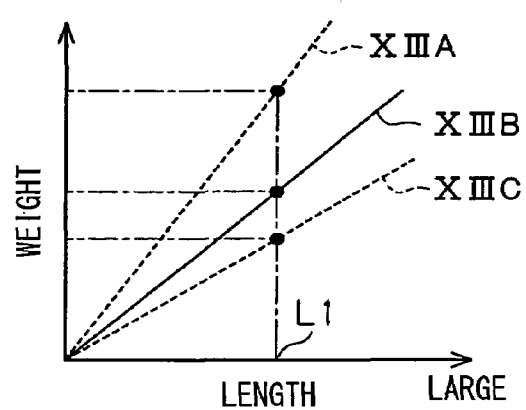
FIG. 13 is a graph showing a relationship between length and weight of the SiC single crystal, according to the second modification of the second embodiment.

Further, as shown in FIG. 12, the diameter can be indirectly measured on the basis of the weight W and the length L of the crystal 14. Specifically, as shown in FIG. 13, the determination whether the crystal 14 is grown with a columnar shape is decided on the basis of the length L and the weight W of the crystal 14. The weight W and the length L of the crystal 14 can be easily measured. Thus, it is easy to estimate the diameter of the crystal 14 on the basis of the weight Wand the length L. The initial diameter of the crystal 14 is defined as φ1. A line XIIIB represents a relationship between the length L and the weight W in a case where the crystal 14 is grown with the columnar shape. When the diameter is increased from φ1 to φ2, the relationship between the length L and the weight W is changed from the line XIIIB to a line XIIIA. Thus, the line XIIIA represents the crystal 14 having the tapered shape so that the diameter of the crystal 14 becomes larger. When the diameter is decreased from φ1, the relationship between the length L and the weight W is changed from the line XIIIB to a line XIIIC. Thus, the line XIIIC represents the crystal 14 having the inverse tapered shape so that the diameter of the crystal 14 becomes smaller.

Furthermore, the diameter can be measured on the basis of change of the growth speed. In this case, the growth speed of the crystal 14 can be detected by the X-ray generating equipment 21 and the image tube 22. The diameter of the crystal 14 is indirectly measured on the basis of the change of the growth speed by using the X-ray. Specifically, when the distance between the crystal 14 and the cover 6a becomes smaller, the raw material gas is accumulated so that the growth speed is increased. Thus, the growth speed and the diameter of the crystal 14 are measured at the same time.

The above described methods for measuring the diameter of the growing crystal 14 such as the means with using the X-ray and the means with using the light can be combined to detect the diameter. Thus, the diameter is detected more accurately, although the inside of the reaction chambers 5, 6 made of graphite is not directly visible.

Although the diameter of the crystal 14 is controlled by changing the insertion amount of the crystal 14 into the cover 6a or by changing the temperature of the cover 6a, the diameter can be controlled by other methods.

For example, the diameter of the crystal 14 can be controlled by using multiple parameters. By changing multiple parameters, the diameter of the crystal 14 is controlled stably and responsively. Here, the parameters include at least a high responsive parameter and a low responsive parameter. By changing a combination of the high responsive parameter and the low responsive parameter, the diameter of the crystal 14 can be controlled to be a predetermined diameter. Thus, the diameter is controlled rapidly and stably. For example, the high responsive parameter is one of the insertion amount of the crystal 14, the partial pressure of the raw material gas and the flow speed of the raw material gas flowing toward the crystal 14. The insertion of the crystal 14 changes the gas flow, the partial pressure changes super-saturation degree directly, and the flow speed affects the boundary between the gas phase and the solid phase of the crystal 14. These parameters affect the crystal growth responsively. Further, if these parameters are not largely changed, the crystallinity of the crystal 14 is not reduced. Thus, the diameter of the crystal 14 is controlled with high response.

On the other hand, the low responsive parameter is, for example, the temperature of the cover 6a or the pulling up speed of the crystal 14. The temperature of the cover 6a provides to heat the side of the crystal 14 by the radiation. It takes long time to heat the side of the crystal 14 after the cover 6a is heated. However, when the difference between the temperature of the cover 6a and the temperature of the crystal 14 becomes larger, the surface of the crystal 14 does not change largely. Therefore, the crystal growth is performed stably. The pulling up speed of the crystal 14 does not change the gas flow rapidly. Thus, the diameter of the crystal 14 is not rapidly changed. Thus, the response of control of the diameter is late. This point is different from that in a silicon crystal growth from melt. Further, when the pulling up speed is changed, the growth condition and the growth temperature are not changed rapidly. Thus, the crystal growth is performed stably.

Further, the diameter of the crystal 14 is controlled by the partial pressure of the raw material gas. Specifically, the raw material gas is diluted by the inert gas and/or the etching gas so that the partial pressure of the raw material gas at the side of the crystal 14 is reduced locally. Thus, the diameter of the crystal 14 is controlled to be smaller or larger.

Figure 14:
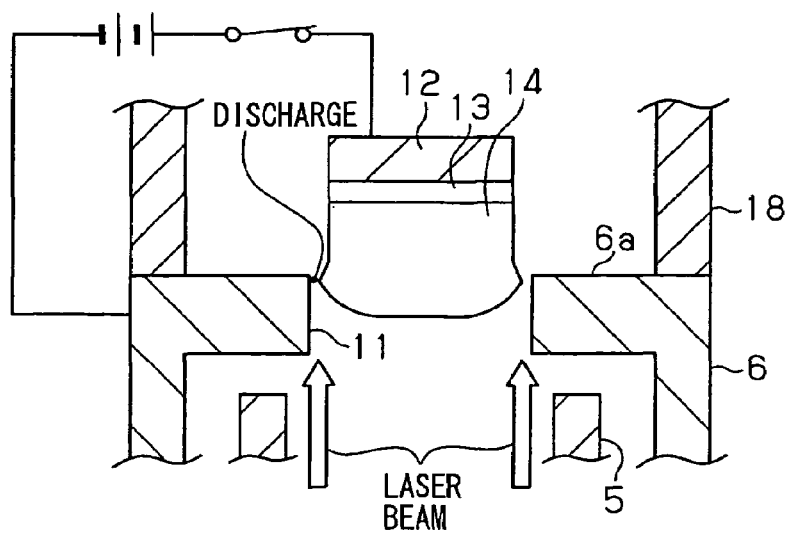
FIG. 14 is a partially cross sectional view showing manufacturing equipment of SiC single crystal according to a third modification of the second embodiment.

Furthermore, the diameter of the crystal 14 is controlled by generation of discharge between the side of the crystal 14 and the cover 6a, as shown in FIG. 14. The discharge causes the temperature increase of the side of the crystal 14. Thus, the diameter of the crystal 14 is directly and positively controlled.

Further, the diameter of the crystal 14 is controlled by laser beam irradiation. The laser beam is irradiated on a part of the side of the crystal 14, the diameter of the part of which is increased. The laser beam is irradiated on a clearance between the side of the crystal 14 and the cover 6a. Thus, without changing the growth condition, the diameter of the crystal 14 is controlled.

As described in the second embodiment, when the diameter of the crystal 14 is controlled by the temperature of the cover 6a, it is effective to etch the surface of the crystal 14 by the etching gas. Specifically, when the diameter of the crystal 14 is reduced, the surface of the crystal 14 is etched so that the diameter of the crystal 14 is rapidly reduced. This method is much effective in a case where the deviation of the diameter is large. Here, after the surface of the crystal 14 is etched, excess particles accumulating on the surface of the crystal 14 are removed by the gas flow having large gas flow amount, which is larger than that in case of etching. Thus, after the excess particle is removed, the crystal growth is continued. Thus, the crystal 14 can be formed with high quality. Further, in other methods for controlling the diameter, when the diameter of the crystal 14 is reduced, the surface of the crystal 14 can be etched by the etching gas.

Third Embodiment

Figure 15:
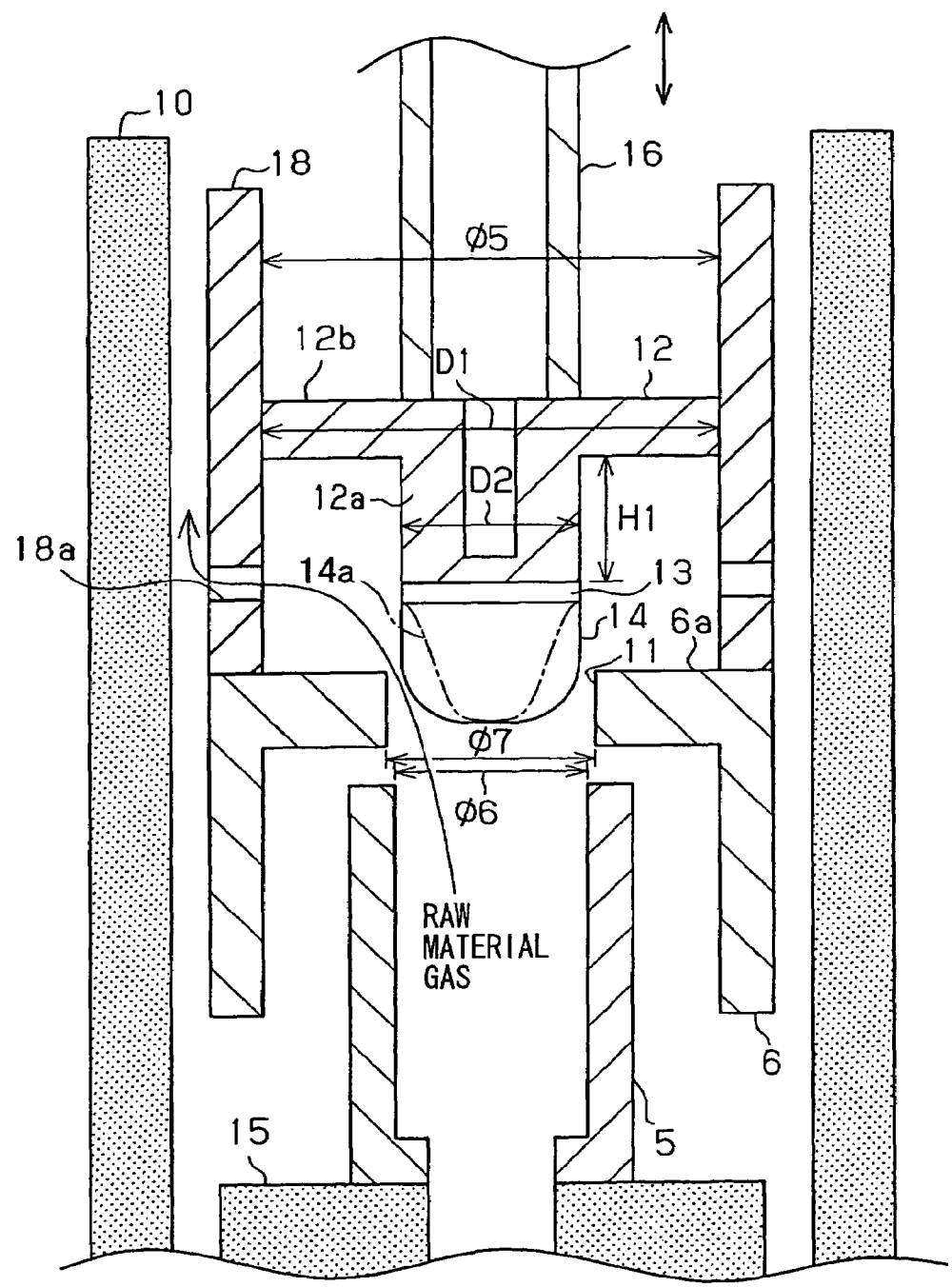
FIG. 15 is a cross sectional view showing manufacturing equipment of SiC single crystal according to a third embodiment of the present invention.
Figure 16:
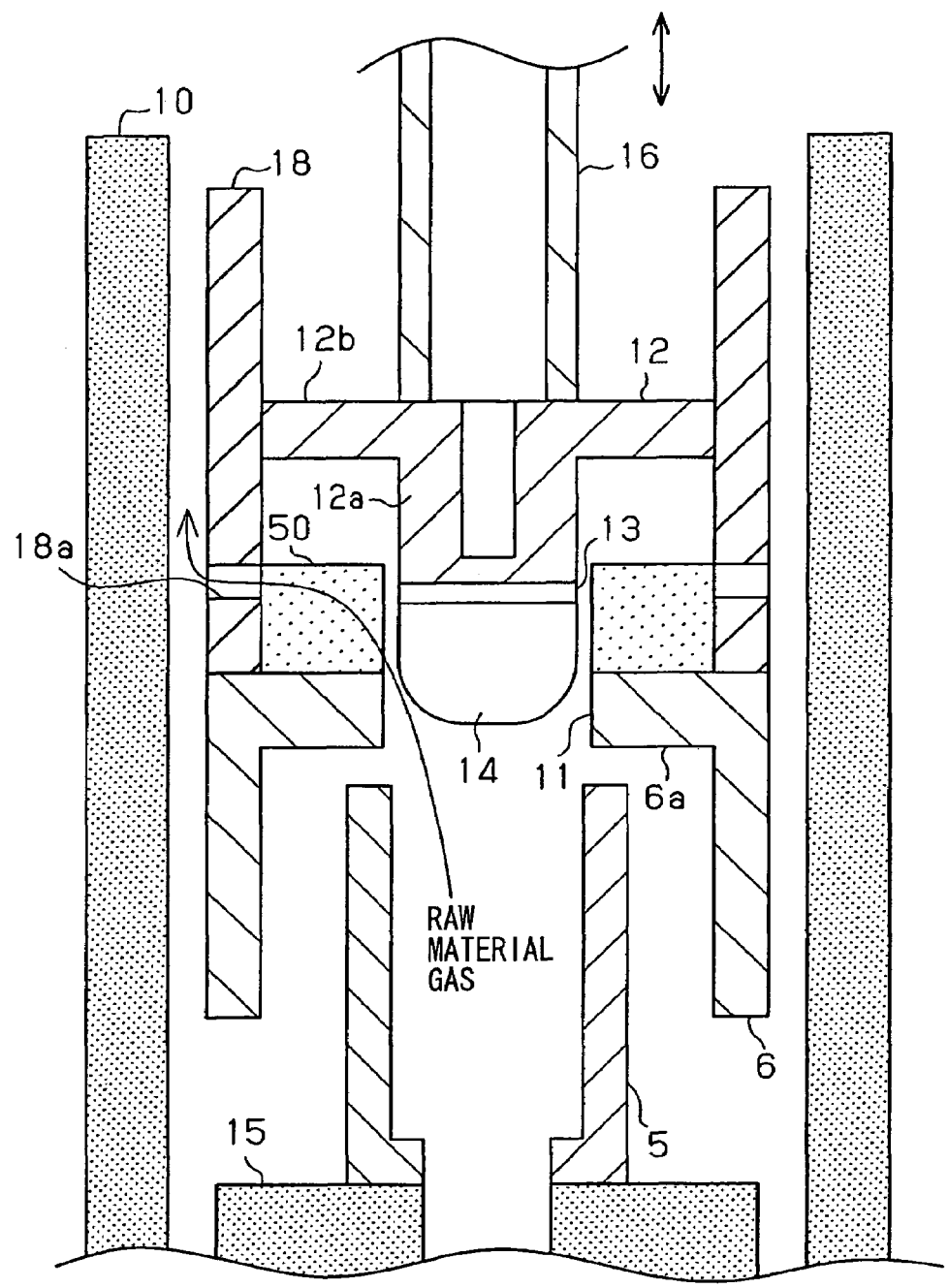
FIG. 16 is a cross sectional view showing manufacturing equipment of SiC single crystal according to a modification of the third embodiment.

Manufacturing equipment according to a third embodiment of the present invention is shown in FIG. 15. The base 12 includes the columnar portion 12a and the circular plate portion 12b. The circular plate portion 12b is formed on one end of the columnar portion 12a. The diameter of the circular plate portion 12b is larger than that of the columnar portion 12a. The seed crystal 13 is fixed on the bottom of the circular portion 12a. The diameter of the columnar portion 12a is almost the same as the seed crystal 13 and the SiC single crystal 14. The seed crystal 13 is bonded to the bottom of the columnar portion 12a with an adhesive.

The base 12 is capable of sliding in such a manner that the outer surface of the circular plate portion 12b contacts the inner surface of the cylindrical member 18. Thus, the base slides in the vertical direction with adhering and contacting the cylindrical member 18. The base 12 is pulled up so that the sliding direction of the base 18 is opposite to the growth direction of the crystal 14.

The cover 6a is disposed under the opening of the cylindrical member 18. The cover 6a includes the guide hole 11. The diameter of the guide hole 11 is defined as ϕ7. The inner diameter of the cylindrical member 18 is defined as ϕ5. The diameter ϕ7 of the guide hole 11 is smaller than the inner diameter ϕ5 of the cylindrical member 18. The raw material gas passes through the guide hole 11. The cover 6a is disposed on the side of the crystal 14.

The diameter of the growing crystal 14 can be measured by the diameter measuring means such as the X-ray generating equipment 21 and the image tube 22. The diameter of the crystal 14 can be controlled by the diameter controlling means such as the vertical movement device 17 so that the diameter is controlled by moving the base 12 in the cylindrical member 18 in the vertical direction. Thus, the diameter of the crystal 14 is controlled to be a predetermined diameter.

In FIG. 15, the outer diameter D1 of the circular plate portion 12b is larger than the outer diameter D2 of the columnar portion 12a. Specifically, the difference between the outer diameter D1 and the outer diameter D2 is in a range between 10 mm and 150 mm.

The raw material gas passes through the guide hole 11 of the cover 6a toward the seed crystal 13. The base 12 includes the columnar portion 12a having the same diameter as the seed crystal 13 and the growing crystal 14 and the circular plate portion 12b having the large diameter larger than the columnar portion 12a. Therefore, the sliding portion between the cylindrical member 18 and the circular plate portion 12b is apart from the guide hole 11, compared with a case where a base is formed of a columnar shape. Therefore, the raw material gas passing through the guide hole 11 is prevented from adhering to the sliding portion. Further, since the base 12 slides with contacting the inner surface of the cylindrical member 18 to the outer surface of the circular plate portion 12b, the raw material gas is prevented from discharging from a clearance between the circular plate portion 12b and the cylindrical member 18. Thus, excess SiC poly crystal is prevented from adhering the sliding portion.

Thus, since SiC poly crystal is prevented from adhering to the sliding portion between the cylindrical member 18 and the circular plate portion 12b of the base 12, the cylindrical member 18 is prevented from fixing to the base 12. The circular plate portion 12b of the base 12 can slide smoothly in the cylindrical member 18 by the shaft 16 and the vertical movement device 17.

Since the difference between the outer diameter D1 of the circular plate portion 12b and the outer diameter D2 of the columnar portion 12a is in a range between 10 mm and 150 mm, the sliding portion between the cylindrical member 18 and the circular plate portion 12b is sufficiently separated from the guide hole 11. Thus, the raw material gas is prevented from adhering to the sliding portion so that SiC poly crystal is prevented from depositing on the sliding portion. When the difference between the outer diameters D1, D2 is larger than 150 mm, the dimensions of the equipment becomes larger. Thus, the manufacturing cost of the equipment becomes higher. When the difference between the outer diameters D1, D2 is smaller than 10 mm, SiC poly crystal is easily deposited on the sliding portion.

Further, the length, i.e., the height H1 of the columnar portion 12a of the base 12 is in a range between 5 mm and 100 mm. In this case, the sliding portion is sufficiently separated from the guide hole 11 so that excess SiC poly crystal is prevented from depositing on the sliding portion. When the height H1 of the columnar portion 12a is larger than 100 mm, the dimensions of the equipment becomes larger. Thus, the manufacturing cost of the equipment becomes higher. When the height H1 of the columnar portion 12a is smaller than 5 mm, SiC poly crystal is easily deposited on the sliding portion.

The inner diameter $\phi 6$ of the lower reaction chamber 5 is equal to or smaller than the diameter $\phi 7$ of the guide hole 11. Preferably, the difference (i.e., $\phi 7 - \phi 6$) between the inner diameter 06 of the lower reaction chamber 5 and the diameter 07 of the guide hole 11 is equal to or smaller than 30 mm. The lower reaction chamber 5 is a cylindrical part for supplying the heated raw material gas to the guide hole 11. The low reaction chamber 5 is disposed to separate from the cover 6a. The raw material gas is heated in the lower reaction chamber 5 so that the raw material gas is thermally decomposed. In this case, the raw material gas is limited from reaching the cover 6a directly. Thus, SiC poly crystal is prevented from adhering to the cover 6a. Thus, the cover 6a is prevented from adhering to the SiC single crystal 14 through SiC poly crystal. The diameter of the crystal 14 is sufficiently controlled by using the cover 6a, so that the crystal growth is performed for sufficiently long time and continuously. When the inner diameter $\phi 6$ of the lower reaction chamber 5 is larger than the diameter $\phi 7$ of the guide hole 11, the raw material gas reaches the cover 6a directly. Thus, excess SiC poly crystal may be deposited on the cover 6a, so that the excess SiC poly crystal is adhered to the SiC single crystal 14. In this case, the crystal growth is prevented from performing for sufficiently longtime and continuously. Since the difference between the inner diameter $\phi 6$ and the diameter $\phi 7$ is equal to or smaller than 30 mm, the diameter of the crystal 14 is easily controlled by using the cover 6a. Thus, the crystal growth can be performed for sufficient long time and continuously. When the difference between the inner diameter 06 and the diameter 07 is larger than 30 mm, the growth speed of the crystal 14 on the outer periphery of the crystal 14 becomes smaller although SiC poly crystal is effectively prevented from adhering to the cover 6a. Thus, as shown a dashed line in FIG. 15, the crystal 14a becomes a convexity shape. Thus, the quality and productivity of the crystal 14 is reduced.

The equipment can have a heat insulation member 50. The heat insulation member 50 is disposed on the top of the cover 6a, so that the heat insulation member 50 is disposed on the downstream side of the gas from the cover 6a. The heat insulation member 50 is disposed in a space, which is surrounded with the cover 6a, the circular plate portion 12b, the columnar portion 12a and the cylindrical member 18. The heat insulation member 50 is made of porous material so that the raw material gas can pass through the heat insulation member 50.

Since the heat insulation member 50 is disposed on the surface of the cover 6a, the heat insulation member 50 prevents the heat from diffusing from the cover 6a to other parts. Thus, the temperature of the cover 6a is increased, so that excess SiC poly crystal is prevented from adhering to the cover 6a. Thus, the SiC poly crystal is prevented from adhering to the SiC single crystal 14. The diameter of the crystal 14 is sufficiently controlled by using the cover 6a, so that the crystal growth is performed for sufficiently long time and continuously.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. Manufacturing equipment of manufacturing a SiC single crystal from a SiC seed crystal, the equipment comprising:

measuring means for measuring a diameter of the SiC single crystal during a crystal growth of the SiC single crystal; and controlling means for controlling the diameter of the SiC single crystal to be a predetermined diameter on the basis of the measured diameter, wherein the measuring means includes a X-ray generating device and a X-ray detector.

2. The equipment according to claim 1, further comprising:

raw material gas supplying means for supplying a raw material gas to the seed crystal.

3. The equipment according to claim 1, further comprising:

a guide cover disposed on a side of the SiC single crystal.

4. Manufacturing equipment of manufacturing a SiC single crystal from a SiC seed crystal, the equipment comprising:

measuring means for measuring a diameter of the SiC single crystal during a crystal growth of the SiC single crystal; and controlling means for controlling the diameter of the SiC single crystal to be a predetermined diameter on the basis of the measured diameter, wherein the measuring means includes a plurality of X-ray generating devices and a plurality of X-ray detectors, which are disposed around the SiC single crystal.

5. Manufacturing equipment of manufacturing a SiC single crystal from a SiC seed crystal, the equipment comprising:

measuring means for measuring a diameter of the SiC single crystal during a crystal growth of the SiC single crystal; and controlling means for controlling the diameter of the SiC single crystal to be a predetermined diameter on the basis of the measured diameter, wherein the measuring means includes a pair of a X-ray generating device and a X-ray detector, which are capable of moving around the SiC single crystal.

6. Manufacturing equipment of manufacturing a SiC single crystal from a SiC seed crystal, the equipment comprising:

a cylindrical member;

a base including a columnar portion and a circular plate portion;

a guide cover disposed on a side of the SiC single crystal;

a measuring device for measuring a diameter of the SiC single crystal during a crystal growth of the SiC single crystal; and a controlling device for controlling the diameter of the SiC single crystal to be a predetermined diameter on the basis of the measured diameter, wherein the circular plate portion is disposed on one end of the columnar portion, the circular plate portion has an outer diameter, which is larger than an outer diameter of the columnar portion, the seed crystal is disposed on the other end of the columnar portion, the base is capable of sliding in the cylindrical member in such a manner that an outer surface of the circular plate portion contacts an inner surface of the cylindrical member, the base is capable of sliding in a sliding direction, which is opposite to a growth direction of the SiC single crystal, the guide cover includes a guide hole, the guide cover is disposed on an opening of the cylindrical member, the guide hole has a diameter, which is smaller than an inner diameter of the cylindrical member, and the guide hole is capable of passing a raw material gas therethrough toward the seed crystal.

7. The equipment according to claim 6, wherein a difference between the outer diameter of the circular plate portion and the outer diameter of the columnar portion is in a range between 10 mm and 150 mm.

8. The equipment according to claim 6, wherein the columnar portion of the base has a length, which is in a range between 5 mm and 100 mm.

9. The equipment according to claim 6, further comprising:

a heat insulation member disposed on a surface of the guide cover, and the surface of the guide cover is disposed on a downstream side of the raw material gas.

10. The equipment according to claim 6, further comprising:

a raw material gas supply cylinder for supplying the raw material gas toward the guide hole, wherein the supply cylinder is disposed apart from the guide cover, and the supply cylinder has an inner diameter, which is equal to or smaller than a diameter of the guide hole of the guide cover.

11. The equipment according to claim 10, wherein a difference between the inner diameter of the supply cylinder and the diameter of the guide hole is equal to or smaller than 30 mm.

* * * * *